United States Patent
Suzuki

(10) Patent No.: US 7,139,187 B2
(45) Date of Patent: Nov. 21, 2006

(54) FERROELECTRIC MEMORY

(75) Inventor: Hideaki Suzuki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/442,343

(22) Filed: May 30, 2006

(65) Prior Publication Data

US 2006/0215438 A1 Sep. 28, 2006

Related U.S. Application Data

(63) Continuation of application No. PCT/JP2004/004118, filed on Mar. 24, 2004.

(51) Int. Cl.
 *G11C 11/22* (2006.01)
 *G11C 7/00* (2006.01)
(52) U.S. Cl. ........................ 365/145; 365/203; 365/207
(58) Field of Classification Search ................ 365/145, 365/203, 207, 189.11
 See application file for complete search history.

(56) References Cited

U.S. PATENT DOCUMENTS 4,984,204 A   1/1991  Sato et al.
5,515,312 A * 5/1996  Nakakuma et al. ......... 365/145
5,675,530 A * 10/1997 Hirano et al. ............... 365/145
5,889,696 A * 3/1999  Kawakubo et al. ......... 365/145
5,898,608 A * 4/1999  Hirano et al. ............... 365/145
6,233,170 B1  5/2001  Yamada

FOREIGN PATENT DOCUMENTS

JP      1-192078 A     8/1989
JP      2000-100176 A  4/2000
JP      2000-187990 A  7/2000

* cited by examiner

*Primary Examiner*—Anh Phung
(74) *Attorney, Agent, or Firm*—Arent Fox PLLC

(57) ABSTRACT

In order to charge a pair of ferroelectric capacitors that constitute a memory cell, a voltage setting circuit sets a voltage difference between both ends of the ferroelectric capacitors to be lower than a coercive voltage in a read operation. A differential sense amplifier amplifies a voltage difference between bit lines generated in accordance with a difference in charging amounts of the ferroelectric capacitors. A voltage difference between both ends of the ferroelectric capacitor being charged is lower than the coercive voltage; accordingly, a polarization vector of the ferroelectric capacitor is inhibited from reversing. As a result, the ferroelectric material can be inhibited from deteriorating owing to the read operation, thereby eliminating the restriction on the number of times of read operations in the ferroelectric memory.

15 Claims, 8 Drawing Sheets

FERROELECTRIC MEMORY

CROSS REFERENCE TO RELATED APPLICATION

This application is a continuation application of International Application PCT/JP 2004/004118, filed Mar. 24, 2004, and designating the U.S.

BACKGROUND OF THE INVENTION

1. Field of the Invention

The invention relates to a ferroelectric memory having ferroelectric capacitors.

2. Description of the Related Art

Ferroelectric memories can retain data without a power supply, by operating their ferroelectric capacitors made of ferroelectric material, which is insulated material, as variable capacitors and utilizing remanent dielectric polarization remaining even after the voltages applied to the ferroelectric capacitors are removed. This nonvolatility is utilized to achieve a nonvolatile memory with ferroelectric memory cells arranged in an array. For the ferroelectric capacitors, ferroelectric materials chiefly composed of PZT (lead zirconate titanate) or ferroelectric materials having a bismuth layer type perovskite structure such as SBT (strontium bismuth tantalate) are available.

In recent years, there has been a proposed technique to generate, in a read operation of a ferroelectric memory, a voltage in a bit line in accordance with a residual dielectric polarization value of the ferroelectric capacitor without driving a plate line. However, for instance, Japanese Unexamined Patent Application Publication No. 2000-187990 (FIG. 18) describes a case where before a read operation, a bit line is precharged to 5 V and a plate line is reset at 0 V. In this case, when a word line is selected, a power supply voltage is applied to both ends of the ferroelectric capacitor, thereby reversing a polarized state of one of ferroelectric capacitors which holds logic 0 and logic 1. That is, data read from this kind of ferroelectric memories are destroyed, and a polarized state of the ferroelectric capacitors is reversed every time a read operation is carried out. The characteristics of the ferroelectric capacitor are deteriorated because of the reverse polarization by a read operation, which accordingly limits the number of read operations. Furthermore, the repetition of the reverse polarization in the read operation consumes electric power uselessly.

SUMMARY OF THE INVENTION

One object of the invention is to eliminate a restriction on the number of read operations of a ferroelectric memory.

Another object of the invention is to reduce the power consumption during the read operation of a ferroelectric memory.

According to a first aspect of a ferroelectric memory of the invention, a pair of ferroelectric capacitors of a memory cell are set to have polarization vectors opposite to each other so that they retain complementary logical values, respectively. Each ferroelectric capacitor is connected at both ends to one of a bit line pair and a plate line, respectively. In order to charge the ferroelectric capacitors, a voltage setting circuit sets a voltage difference between both ends of each ferroelectric capacitor to be lower than a coercive voltage in a read operation. A differential sense amplifier amplifies a voltage difference between the bit lines occurring in accordance with a difference in charging amounts of the ferroelectric capacitors. A voltage difference between both ends of a ferroelectric capacitor being charged is lower than the coercive voltage, thereby inhibiting a polarization vector of the ferroelectric capacitor from reversing. As a result, the ferroelectric material can be inhibited from deteriorating due to the read operation, thereby eliminating the restriction on the number of read operations of the ferroelectric memory. Since the polarization vector is not reversed, even a power supply shut-off during the read operation does not destroy data stored in the memory cell. That is, the non-volatility can be maintained. Furthermore, during the read operation, a hysteresis loop as a trajectory of a variation of a dielectric polarization value of the ferroelectric capacitor can be made smaller in size, so that the power consumption during the read operation can be reduced.

In a preferable example of the first aspect of the ferroelectric memory according to the invention, a pair of transistors of a level converter are connected to bit lines at gates, respectively, connected to a power supply line at either of sources and drains, and connected to a differential input of a differential sense amplifier at the other of the sources and drains. Accordingly, a voltage of a bit line pair, after amplified at the level converter, is further amplified at the differential sense amplifier. Thus, even with a small voltage difference between the bit line pair, the differential sense amplifier can reliably perform an amplification operation to read data stored in the memory cell. Since the bit line pair is connected through the level converter to the differential sense amplifier, the bit line pair is not affected directly by an operation of the differential sense amplifier. As a result, a voltage of the bit line pair can be inhibited from fluctuating owing to an operation of the differential sense amplifier, thereby preventing incorrect data from being read. Furthermore, an inadvertent voltage can be inhibited from being applied to the ferroelectric capacitor.

According to a second aspect of the ferroelectric memory of the invention, the ferroelectric memory includes the memory cell, the pair of bit lines, the plate line and the level converter. Thus, even with a small voltage difference between the bit line pair, the differential sense amplifier can reliably perform an amplification operation to read data stored in the memory cell. Since the bit line pair is not affected directly by an operation of the differential sense amplifier, a voltage of the bit line pair can be inhibited from fluctuating owing to an operation of the differential sense amplifier, thereby preventing incorrect data from being read.

In a preferable example in the first and second aspects of the ferroelectric memory according to the invention, a memory cell has a transfer gate that connects one end of each of the ferroelectric capacitors to bit lines. In a read operation, before the transfer gate is turned on, a precharging circuit temporarily connects each of the bit lines to a voltage line with a predetermined voltage. Because of this, the bit line pair is charged to a predetermined voltage before data are read from the memory cell, and then is held in a floating state. Accordingly, it is possible to accurately change a voltage of each of the bit lines in accordance with a capacitance value of each of the ferroelectric capacitors and to reliably read data stored in the memory cell in a read operation.

In a preferable example in the first and second aspects of the ferroelectric memory according to the invention, a precharging circuit includes a power switch, a ground switch and an equalizing switch. The power switch and ground switch are temporarily turned on to connect a pair of bit lines to the power line and the ground line respectively. The equalizing switch connects the pair of bit lines to each other after the power switch and ground switch are turned off. Accordingly, without a complex circuit for generating a precharging voltage formed in the ferroelectric memory, the bit line pair can be utilized to readily generate a precharging voltage.

In a preferable example in the first and second aspects of the ferroelectric memory according to the invention, a pair of transistors constituting a level converter are pMOS transistors. In a read operation, a precharging voltage of the bit line is preferably set low to lower the power consumption. Also, the precharging voltage of the bit line has to be low for making a voltage applied to both ends of the ferroelectric capacitor lower than the coercive voltage. After electric charges on the bit line are charged to the ferroelectric capacitor, the voltage of the bit line goes further lower. Therefore, it is preferable that the transistor of the level converter is constituted of pMOS transistors so as to increase a gate-to-source voltage and operate at high speed during a read operation. In other words, forming the transistor with the pMOS transistor makes it possible to carry out a read operation at high speed.

In a preferable example in the first and second aspects of the ferroelectric memory according to the invention, in a read operation a leak prevention switch connects sources (or drains) of a pair of transistors of the level converter to a power supply line in a predetermined period before the differential sense amplifier operates, and disconnects the connection immediately before the differential sense amplifier starts operating. Thus, unnecessary current flow, not contributing to the operation, from the level converter to the differential sense amplifier is preventable while the differential sense amplifier is in operation, thereby reducing the power consumption during the read operation.

In a preferable example in the first and second aspects of the ferroelectric memory according to the invention, after the differential sense amplifier start operating, restore switches connect differential outputs of the differential sense amplifier to the bit lines respectively. Accordingly, the differential sense amplifier does not need to drive the bit line for some time after the start of the amplification operation. This enables high-speed amplification operation and a decrease in read access time. When the shortening of the access time is not required, a layout size of the differential sense amplifier can be decreased. The restore switch is turned on after a voltage corresponding to read data is sufficiently generated by the differential sense amplifier. The differential outputs of the differential sense amplifier are connected to the bit lines to carry out a restore operation of the memory cell. Through the restore operation, a residual dielectric polarization value of the ferroelectric capacitor returns to an original value. That is, data stored in the memory cell can be inhibited from being destroyed.

In a preferable example in the first and second aspects of the ferroelectric memory according to the invention, a pre-sense amplifier includes pMOS transistors each connected to one of the bit lines at a gate and connected to the other of the bit lines at a drain, and connected to a predetermined voltage line at a source. Each of the restore switches includes an nMOS transistor which is connected to one of the bit lines and one of the differential outputs of the differential sense amplifier at a source and a drain, respectively. In a case where the restore switch is constituted of the nMOS transistor, a high level voltage (for instance, power supply voltage) amplified by the differential sense amplifier is lowered by a threshold voltage of the nMOS transistor and transmitted to the bit line. However, owing to the pre-sense amplifier, the voltage of the bit line is set at a high level voltage without a decrease. As a result, a restore operation can be reliably carried out.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENTS

Figure 1:
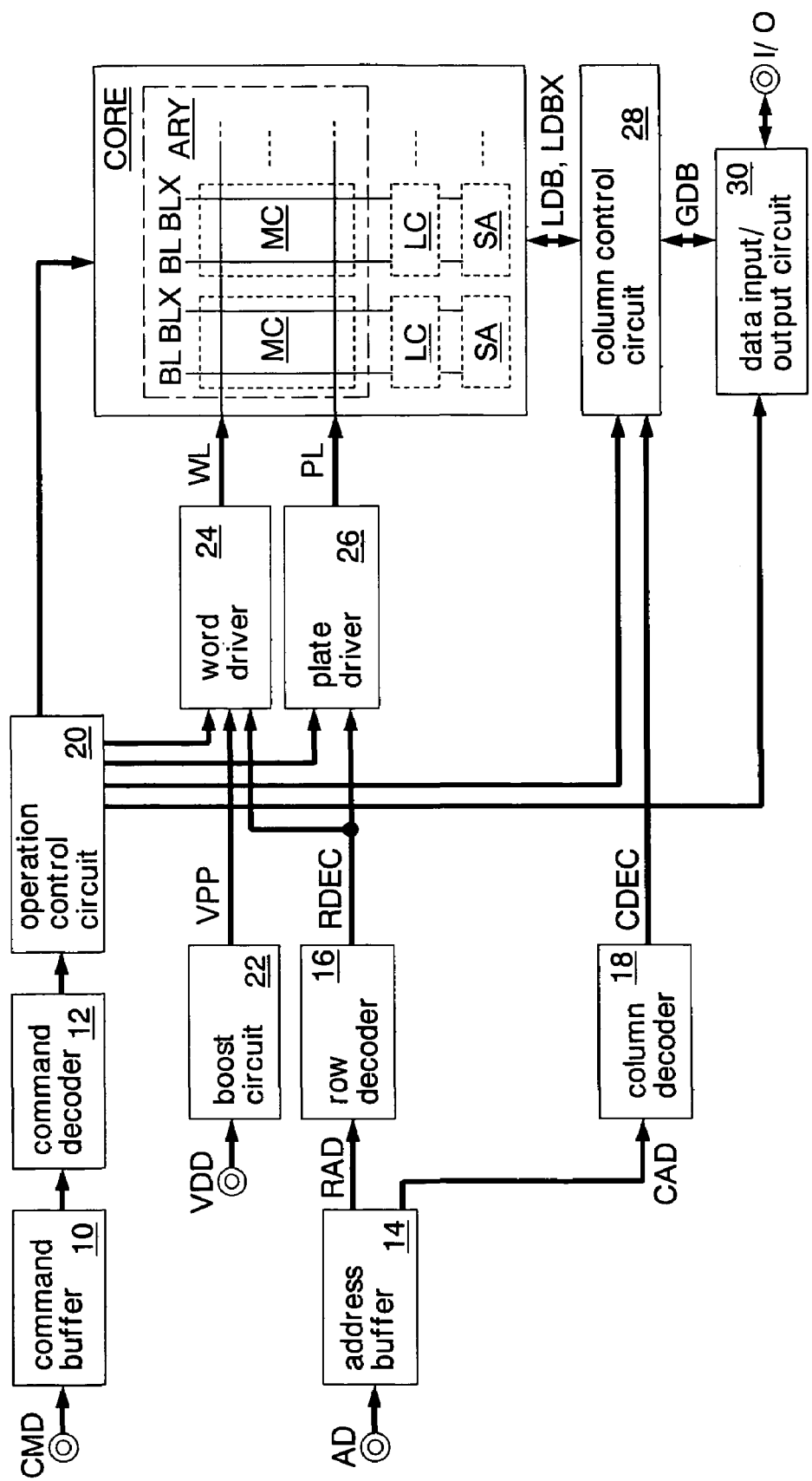
FIG. 1 is a block diagram showing a first embodiment of a ferroelectric memory of the present invention.

Preferred embodiments of the invention will now be described with reference to the accompanying drawings. In the drawings, double circles denote an external terminal, and a bold signal line denotes a plurality of signal lines. A part of a block connected to a bold line is composed of a plurality of circuits. Signals supplied through the external terminals are designated by the same reference symbols as the names of the terminals. A signal line through which a signal is transferred is denoted by a symbol equal to the name of the signal.

FIG. 1 shows a first embodiment of a ferroelectric memory according to the invention. The ferroelectric memory is formed on a silicon substrate by use of a CMOS process. The ferroelectric memory is incorporated as a memory core in a system LSI mounted on, for instance, a mobile phone. When the ferroelectric memory is adopted, a plurality of kinds of memories (for instance, flash memory and DRAM) that is so far used in a mobile phone can be reduced to one kind.

The ferroelectric memory includes a command buffer 10, a command decoder 12, an address buffer 14, a row decoder 16, a column decoder 18, an operation control circuit 20, a voltage booster 22, a word driver 24, a plate driver 26, a memory core CORE, a column control circuit 28 and a data input/output circuit 30.

The command buffer 10 receives a command signal CMD such as a chip select signal, an output enable signal or a write enable signal through a command terminal CMD and outputs to the command decoder 12. The command decoder 12 decodes the command signal CMD and outputs a decoded result to the operation control circuit 20. As the kind of the command, there are a read command, a write command and a standby command that shows that these commands are not inputted.

For instance, when a chip enable signal is set in an active state and a write enable signal is set in a non-active state, a read command is recognized. When the chip enable signal and write enable signal are set in an active state, a write command is recognized. When the chip enable signal, the write enable signal and an output enable signal are set in a non-active state, the standby command is recognized.

The address buffer 14 receives an address signal AD through an address terminal AD and outputs upper bits and lower bits of the received address signal AD as a row address signal RAD and a column address signal CAD, respectively. The row decoder 16 decodes the row address signal RAD to generate a decoding signal RDEC and outputs to the word driver 24 and the plate driver 26. The column decoder 18 decodes the column address signal CAD to generate a decoding signal CDEC and outputs to the column control circuit 28.

The operation control circuit 20, in accordance with an output of the command decoder 12, in order to carry out a read operation and a write operation to a memory core CORE, generates control signals that control operations of the word driver 24, the plate driver 26, the column control circuit 28 and the data input/output circuit 30. A period when the read operation and write operation are not carried out is a standby period. The operation control circuit 20 maintains the control signals at a predetermined level during the standby period.

The voltage booster 22, by use of a power supply voltage VDD (for instance, 2 V) supplied through a power supply terminal, generates a booster voltage VPP (for instance, 2.5 V) that is used in a high level voltage of a word line WL. The word driver 24, during a read operation and a write operation, responds to a control signal from the operation control circuit 20 to select a word line WL corresponding to a decoding signal RDEC. A selected word line WL is set to the boosted voltage VPP and a word line WL that is not selected is set to a ground voltage VSS. During the standby period, a nonvolatile write operation and a recall operation, the word driver 24 maintains all the word lines WL at a low level (VSS). When a bootstrap circuit is incorporated in the word driver 24, the booster circuit 22 becomes unnecessary. In this case, a high level of the word line WL is knocked up to a power supply voltage VDD+α by the bootstrap that makes use of a capacitance coupling of a gate of the bootstrap circuit. In the bootstrap method, since a time until a boosted voltage is generated is shorter than that of the booster circuit method, immediately after the power is turned on, an access can be started. Accordingly, in particular, in applications where a ferroelectric memory is mounted on IC cards, the bootstrap method is advantageous.

The plate driver 26, during a read operation and a write operation, responding to a control signal from the operation control circuit 20, selects a plate line PL corresponding to a decoding signal RDEC. A selected plate line PL, during a predetermined period, changes from a low level (VSS) to a high level (VDD). The plate driver 26, during the standby period, maintains all plate lines at a low level (VSS).

The memory core CORE includes a memory cell array ARY that has a plurality of memory cells MC arranged in array and bit line pairs BL and BLX, level converters LC connected to the bit line pairs BL and BLX and differential sense amplifiers SA connected to an output of the level converters LC. Details of the memory core CORE will be described in FIG. 2.

The column control circuit 28 has column switches that, responding to a control signal from the operation control circuit 20, connect local data bus lines LDB and LDBX corresponding to a decoding signal CDEC to a global data bus line GDB. The data input/output circuit 30, responding to a control signal from the operation control circuit 20, outputs external write data to the column control circuit 28 or read data from the column control circuit 28 to the data terminal I/O. The number of the data terminals I/O is for instance 16 bit.

Figure 2:
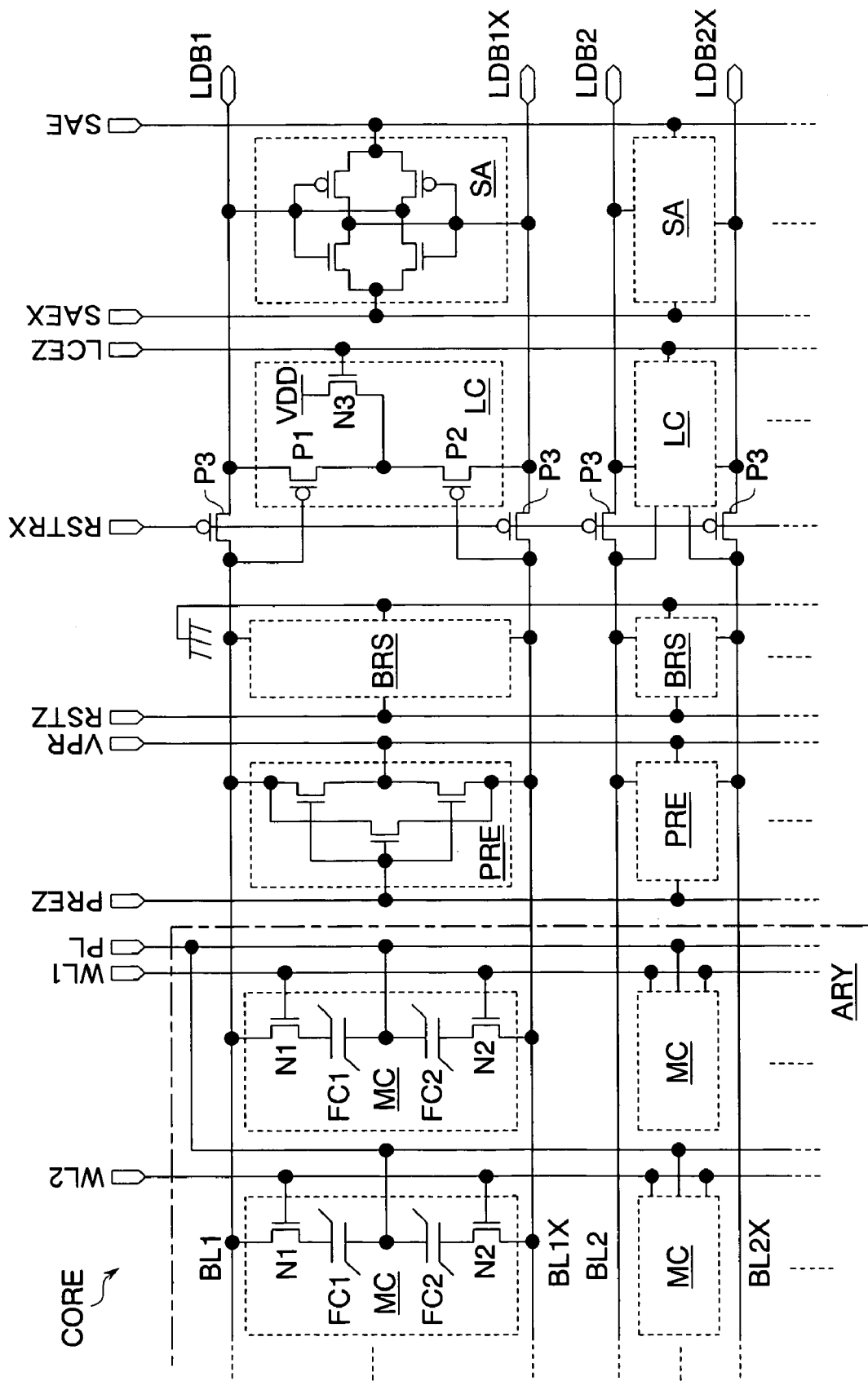
FIG. 2 is a circuit diagram showing the details of the memory core shown in FIG. 1.

In FIG. 2, the memory core CORE shown in FIG. 1 is shown in detail. Each of the memory cells MC of the memory array ARY, in order to hold information of 1 bit, has a pair of transfer transistors N1 and N2 (transfer gates) and a pair of ferroelectric capacitors FC1 and FC2. One ends of the ferroelectric capacitors FC1 and FC2, respectively, are connected through the transfer transistors N1 and N2 to complementary bit line pairs BL (BL1, BL2, . . . ) and BLX (BLX1, BLX2, . . . ). The other ends of the ferroelectric capacitors FC1 and FC2 are connected to a common plate line PL. Gates of the transfer transistors N1 and N2 are connected to a common word line WL (WL1, WL2, . . . ). The plate line PL is wired commonly for every plurality of memory cells MC connected to a predetermined number of word lines WL.

The level converter LC has a pair of pMOS transistors P1 and P2 where gates thereof are connected respectively to the bit lines BL and BLX and an nMOS transistor N3 (leak prevention switch) that connects sources of the pMOS transistors P1 and P2 to a power supply line VDD. Drains of the pMOS transistors P1 and P2 are connected through complementary local data bus lines LDB (LDB1, LDB2, . . . ) and LDBX (LDB1X, LDB2X, . . . ) to an input/output node of the differential sense amplifier SA. A gate of the nMOS transistor N3 receives an enable signal LCEZ.

The sense amplifier SA is constituted of a pair of CMOS inverters of which input and output are connected each other. An input and output of the CMOS inverter, respectively, are connected to the local data bus lines LDB and LDBX. A source of a pMOS transistor of the CMOS investor receives a sense amplifier activation signal SAE and a source of the nMOS transistor of the CMOS investor receives a sense amplifier activation signal SAEX.

Furthermore, the memory core CORE has a pMOS transistor P3 (restore switch), a precharging circuit PRE and a bit line reset circuit BRS. In the pMOS transistor P3, one and the other of source and drain are connected to a bit line BL (or BLX) and the local data bus line LDB (or LDBX) and a gate receives a restore signal RSTRX. The restore switch P3 has a function by which a connection state of the bit lines BL and BLX and the differential sense amplifier SA is changed from a disconnected state to a connected state during a read operation. The restore switch P3 may be constituted of an nMOS transistor. In this case, a gate voltage for turning on the nMOS transistor is set to a boosted voltage VPP or a power supply voltage VDD+α boosted by a bootstrap that makes use of the capacitance coupling of the gate.

The precharging circuit PRE has nMOS transistors that connect the bit lines BL and BLX, respectively, to a precharging voltage line VPR and an nMOS transistor that connects the bit lines BL and BLX each other. Each of the nMOS transistors receives a precharging signal PREZ at the gate. Here, a voltage VPR of the precharging voltage line VPR is set at a value lower than coercive voltages of the ferroelectric capacitors FC1 and FC2 to inhibit reverse polarization from occurring during a read operation. That is, the precharging circuit PRE operates as a voltage setting circuit that sets a voltage difference between both ends of the respective ferroelectric capacitors FC1 and FC2 lower than the coercive voltage. By thus setting, during a read operation except for the restore operation, a voltage equal to or more than the coercive voltage can be inhibited from being applied between both ends of the respective ferroelectric capacitors FC1 and FC2. In general, the coercive voltage is 0.8 to 1.0 V when the ferroelectric material is PZT and 0.5 to 0.9 V when the ferroelectric material is SBT.

When a [(capacitance of a ferroelectric capacitor)/(capacitance of a ferroelectric capacitor+bit line capacitance)] is assumed 20%, a voltage of the bit line before the word line WL is selected is VBL and a voltage applied to the ferroelectric capacitor is VFE, [a voltage VFE=0.8×VBL] is obtained. Accordingly, in the case of the ferroelectric material being, for instance, PZT, when the precharging voltage VPR (bit line voltage) is set in the range of 1.0 to 1.2 V, a voltage applied on both ends of the ferroelectric capacitor can be set equal to or lower than the coercive voltage.

The bit line reset circuit BRS has a circuit configuration same as the precharging circuit PRE and, though omitted from showing in the drawing, includes nMOS transistors that connect the bit lines BL and BLX, respectively, to the ground line VSS and an nMOS transistor that connects the bit lines BL and BLX each other. The respective nMOS transistors receive a bit line reset signal RSTZ at the gate thereof.

Though not particularly shown in the drawing, the memory core CORE has a data bus line reset circuit that connects the local data bus lines LDB and LDBX to the ground line VSS. The data bus line reset circuit has a circuit configuration same as the bit line reset circuit BRS. Control signals PREZ, RSTZ, RSTRX, LCEZ, SAE and SAEX that are supplied to the memory core CORE and a data bus line reset signal supplied to the not shown data bus line reset circuit are generated by the operation control circuit 20 shown in FIG. 1.

Figure 3:
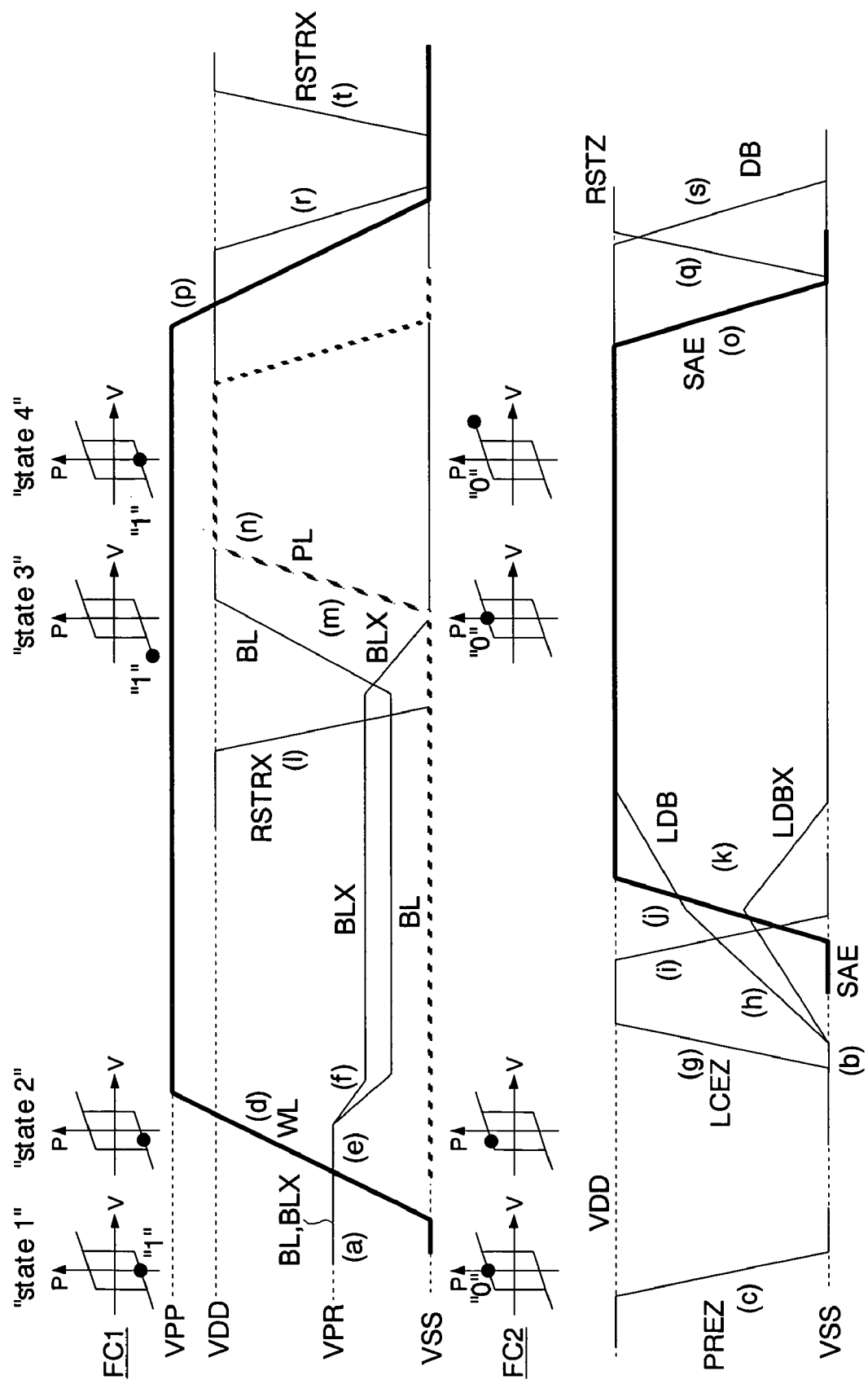
FIG. 3 is a waveform diagram showing a read operation of the ferroelectric memory according to the first embodiment.

FIG. 3 shows a read operation of a ferroelectric memory according to the first embodiment. In the example, in a memory cell MC, logic 1 is written beforehand, and ferroelectric capacitors FC1 and FC2 have polarization vectors different from each other. As shown in a "state 1" of a hysteresis loop (P-V characteristics showing relationship of the dielectric polarization value P and an applied voltage V) in the drawing, for instance, in the ferroelectric capacitor FC1 where logic 1 is stored, the residual dielectric polarization value is negative and in the ferroelectric capacitor FC2 where logic 0 is stored, the residual dielectric polarization value is positive. Before a read operation is started, the bit lines BL and BLX are set at a precharging voltage VPR by the bit line reset circuit BRS, and the local data bus lines LDB and LDBX, after resetting at a ground voltage VSS by a not shown data bus line reset circuit, keeps a floating state (FIGS. 3 (a, b)).

When a read command and an address signal AD are supplied through a command terminal CMD and an address terminal AD, the operation control circuit 20 inactivates a precharging signal PREZ (FIG. 3 (c)). Owing to the inactivation, the bit lines BL and BLX become a floating state in a state precharged to a precharging voltage VPR. The word driver 24 selects a word line WL corresponding to a row address signal RAD and changes the selected word line WL to a boosted voltage VPP (FIG. 3 (d)). Owing to the change, transfer transistors N1 and N2 of the memory cell MC are turned on and one ends of the ferroelectric capacitors FC1 and FC2 are connected to the bit lines BL and BLX.

The plate line PL is reset to the ground voltage VSS so that a precharging voltage VPR is temporarily applied between both ends of the ferroelectric capacitors FC1 and FC2 (FIG. 3(e)). As a result, dielectric polarization values of the ferroelectric capacitors FC1 and FC2 become as shown in "state 2". Here, a voltage V of the hysteresis loop shown in the drawing shows a voltage of the plate line PL with a voltage of the bit lines BL and BLX as a reference. Accordingly, on the hysteresis loop, both ends of the ferroelectric capacitors FC1 and FC2 receive a voltage "−VPR". The precharging voltage VPR, as mentioned above, is lower than the coercive voltage so that polarized states of the ferroelectric capacitors FC1 and FC2 are not reversed owing to an application of the precharging voltage VPR.

Electric charges on the bit lines BL and BLX are partially charged to the ferroelectric capacitors FC1 and FC2. The ferroelectric capacitors FC1 and FC2 have polarization vectors different from each other and capacitance values thereof are different from each other. Accordingly, voltages of the bit lines BL and BLX are different from each other (FIG. 3(f)). For instance, when a capacitance value of the ferroelectric capacitor FC1 (memorizes logic 1) connected to the bit line BL is larger than a capacitance value of the ferroelectric capacitor FC2 (memorizes logic 0) connected to the bit line BLX, a voltage of the bit line BL becomes lower than that of the bit line BLX.

In the next place, an enable signal LCEZ is activated (FIG. 3 (g)), and, in pMOS transistors P1 and P2 of the level converter LC, sources are connected to a power supply line VDD (2 V) to operate as an amplifier. The precharging voltage VPR, as mentioned above, is set to substantially 1.0 to 1.2 V. A voltage of the bit lines BL and BLX becomes lower by substantially 0.2 V than the precharging voltage VPR and a gate-to-source voltage of the pMOS transistors P1 and P2 becomes substantially −1.8 to −1.3 V. Accordingly, in comparison with a case where the level converter LC is constituted of an nMOS transistor, a high speed operation can be realized. Since the high-speed operation can be realized, a MOS size can be made smaller. As a result, a disadvantage in size of the pMOS transistor to the nMOS transistor can be overcome.

Voltages of the local data bus lines LDB and LDBX rise in accordance with voltages of the bit lines BL and BLX (FIG. 3(h)). In the example, since voltages of the bit lines are BL<BLX, a voltage of the local data bus line LDB connected through the pMOS transistor P1 to the bit line BL becomes higher than a voltage of the local data bus line LDBX. After a voltage difference between the local data bus lines LDB and LDBX is widened at a certain degree, the enable signal LCEZ is inactivated (FIG. 3 (i)). In order to inactivate the enable signal LCEZ immediately before the differential sense amplifier SA starts operating, the enable signal LCEZ is generated by use of a timing signal that generates sense amplifier activation signals SAE and SAEX.

Subsequently, the sense amplifier activation signals SAE and SAEX are activated, and thereby the differential sense amplifier SA starts operating (FIG. 3 (j)). The sense amplifier activation signal SAEX is a reversed signal of the sense amplifier activation signal SAE; accordingly, it is omitted from showing in the drawing. Owing to an amplification operation of the differential sense amplifier SA, voltages of the local data bus lines LDB and LDBX, respectively, change to a power supply voltage VDD and a ground voltage VSS (FIG. 3 (k)). Then, the column control circuit 28 and the data input/output circuit 30 shown in FIG. 1 operate to output through a data terminal I/O read data.

When the differential sense amplifier SA starts operating, since the enable signal LCEZ is inactivated and the level converter LC has been inactivated, a feedthrough current is inhibited from flowing from a power supply line VDD of the level converter LC to a ground line VSS (=a low level of SAEX signal) of the differential sense amplifier SA. Accordingly, during a read operation, the power consumption can be inhibited from increasing owing to a useless current that does not contribute to an operation.

Furthermore, when the differential sense amplifier SA start operating and voltages of the local data bus lines LDB and LDBX are changing, the restore switch P3 is turned off and the bit lines BL and BLX are not connected to the differential sense amplifier SA. Accordingly, voltages of the bit lines BL and BLX can be inhibited from being affected by noise owing to an operation of the differential sense amplifier SA and by a voltage change of the local data bus lines LDB and LDBX. As a result, polarized states of the ferroelectric capacitors FC1 and FC2 can be inhibited from being affected by the noise of the differential sense amplifier SA and by the voltage change of the local data bus lines LDB and LDBX. It can be also inhibited that, owing to an operation of the differential sense amplifier SA, in the bit lines BL (BLX) adjacent to each other, a coupling noise is generated.

Furthermore, when the restore switch P3 is turned off, the differential sense amplifier SA does not need to charge/discharge the bit lines BL and BLX. Accordingly, a sensing speed of read data can be increased and thereby a read access time can be shortened. In other words, a drivability of the differential sense amplifier SA can be made smaller and a layout size thereof can be made smaller.

Thereafter, after voltages of the local data bus lines LDB and LDBX, respectively, change to the power supply voltage VDD and the ground voltage VSS, the restore signal RSTRX is activated (FIG. 3(*l*)). Owing to the activation of the restore signal RSTRX, the bit lines BL and BLX are connected to the local data bus lines LDB and LDBX, respectively. Accordingly, voltages of the bit lines BL and BLX change to a high level and a low level, respectively (FIG. 3 (*m*)). Since a voltage of the plate line PL is at the ground voltage VSS, to both ends of the ferroelectric capacitor FC1 connected to the bit line BL, −VDD is applied ("state 3"). That is, in the ferroelectric capacitor FC1 that stores logic 1, logic 1 is restored. On the other hand, in "state 3", a voltage difference between both ends of the ferroelectric capacitor FC2 connected to the bit line BLX is 0 V.

Thereafter, the plate line PL is activated for a predetermined period and thereby a restore operation of the ferroelectric capacitor FC2 that stores logic 0 is carried out (FIG. 3 (*n*)). Specifically, a restore operation of the ferroelectric capacitor FC2 is carried out when to both ends of the ferroelectric capacitor FC2 connected to the bit line BLX the power supply voltage VDD and the ground voltage VSS are applied ("state 4"). On the other hand, in the "state 4", a voltage difference between both ends of the ferroelectric capacitor FC1 connected to the bit line BL is 0 V. The plate line PL may well be changed only during the restore time; accordingly, the number of times of driving the plate line PL can be reduced and thereby the power consumption can be reduced.

In the next place, after the plate line PL is inactivated, the sense amplifier activation signals SAE and SAEX are inactivated, and thereby, the differential sense amplifier SA ceases to operate (FIG. 3 (*o*)). Thereafter, the word line WL is inactivated (FIG. 3 (*p*)) and the bit lines BL and BLX and the ferroelectric capacitors FC1 and FC2 are disconnected. Substantially simultaneously, the bit line reset signal RSTZ and a data bus line reset signal not shown in the drawing are activated (FIG. 3 (*q*)) and the bit lines BL and BLX and the local data bus lines LDB and LDBX are reset to the ground voltage VSS (FIG. 3 (*r*, *s*)). Finally, the restore signal RSTRX is inactivated (FIG. 3 (*t*)), thereby a read operation comes to completion.

In the read operation, except for the restore operation, to both ends of each of the ferroelectric capacitors FC1 and FC2, a voltage exceeding the coercive voltage is not applied. Accordingly, during the read operation, the polarization vector is not reversed. Accordingly, a ferroelectric material of the ferroelectric capacitors FC1 and FC2 can be inhibited from deteriorating. Furthermore, in general, in the P-V characteristics diagram, an area of a curve (closed loop) showing a variation of the dielectric polarization value is proportional to the consumption power. In the embodiment, since during the read operation the dielectric polarization values of the ferroelectric capacitors FC1 and FC2 do not change so much, an area of the closed loop is small, that is, the power consumption during the read operation is small.

Furthermore, as shown in hysteresis curves in FIG. 3, polarization vectors of the ferroelectric capacitors FC1 and FC2 are always in opposite directions to each other during the read operation. Accordingly, even when during the read operation owing to some inconveniences a power supply voltage VDD is stopped supplying to the ferroelectric memory, data stored in the memory cell MC can be inhibited from disappearing. In more detail, after the power supply is turned on again, when data of all the memory cells MC are read, residual dielectric polarization values of the ferroelectric capacitors FC1 and FC2 can be returned to original values.

As described above, in the embodiment, the polarization vectors of the ferroelectric capacitors FC1 and FC2 can be inhibited from reversing during the read operation; accordingly, the ferroelectric material can be inhibited from deteriorating and the restriction on the number of times of reading the ferroelectric memory can be eliminated. Since the polarization vector is not reversed, even when a power supply is shutdown during the read operation, data stored in the memory cell MC can be inhibited from being destroyed. During the read operation, since an area of the hysteresis loop that is a trajectory of a change of the dielectric polarization value of each of the ferroelectric capacitors FC1 and FC2 can be made small, the consumption power during the read operation can be reduced.

Since voltages of the bit lines BL and BLX, respectively, are amplified at the level converter LC, followed by further amplifying at the differential sense amplifier SA, even when the voltage difference between the bit line pair BL and BLX is small, the differential sense amplifier SA can be assuredly operated so as to amplify and thereby data stored in the memory cell MC can be rightly read.

Before, owing to the precharging circuit PRE, in the read operation, the transfer transistors N1 and N2 are turned on, when the respective bit lines BL and BLX are temporarily connected to the precharging voltage line VPR, voltages of the respective bit lines BL and BLX can be precisely varied in accordance with the capacitance values of the respective ferroelectric capacitors CF1 and CF2 and thereby data stored in the memory cell MC can be assuredly read.

When the level converter LC is constituted of pMOS transistors P1 and P2, voltages of the bit lines BL and BLX that are lower than the coercive voltage can be assuredly amplified and the amplification speed as well can be improved. As a result, a read access time can be shortened.

When the level converter LC is provided with an nMOS transistor N3 (leak prevention switch), during the read operation, the feedthrough current can be inhibited from flowing from the level converter LC to the differential sense amplifier SA and thereby the power consumption can be saved.

When the bit lines BL and BLX are connected through the restore switch P3 to the differential sense amplifier SA, the differential sense amplifier SA, for the time being after the start of the amplification operation, is not required to drive the bit lines BL and BLX. Accordingly, the amplification operation can be carried out at high speed and thereby the access time of read operation can be shortened. When there is no need of shortening the access time, the layout size of the differential sense amplifier SA can be made smaller. Furthermore, owing to the restore switch P3, the bit lines BL and BLX can be inhibited from being directly affected by an operation of the differential sense amplifier SA. That is, voltages of the bit lines BL and BLX can be inhibited from fluctuating owing to an operation of the differential sense amplifier SA to read wrong data. When the restore switch P3 is turned on, a restore operation can be assuredly carried out. Accordingly, data stored in the memory cell MC can be inhibited from being destroyed.

Figure 4:
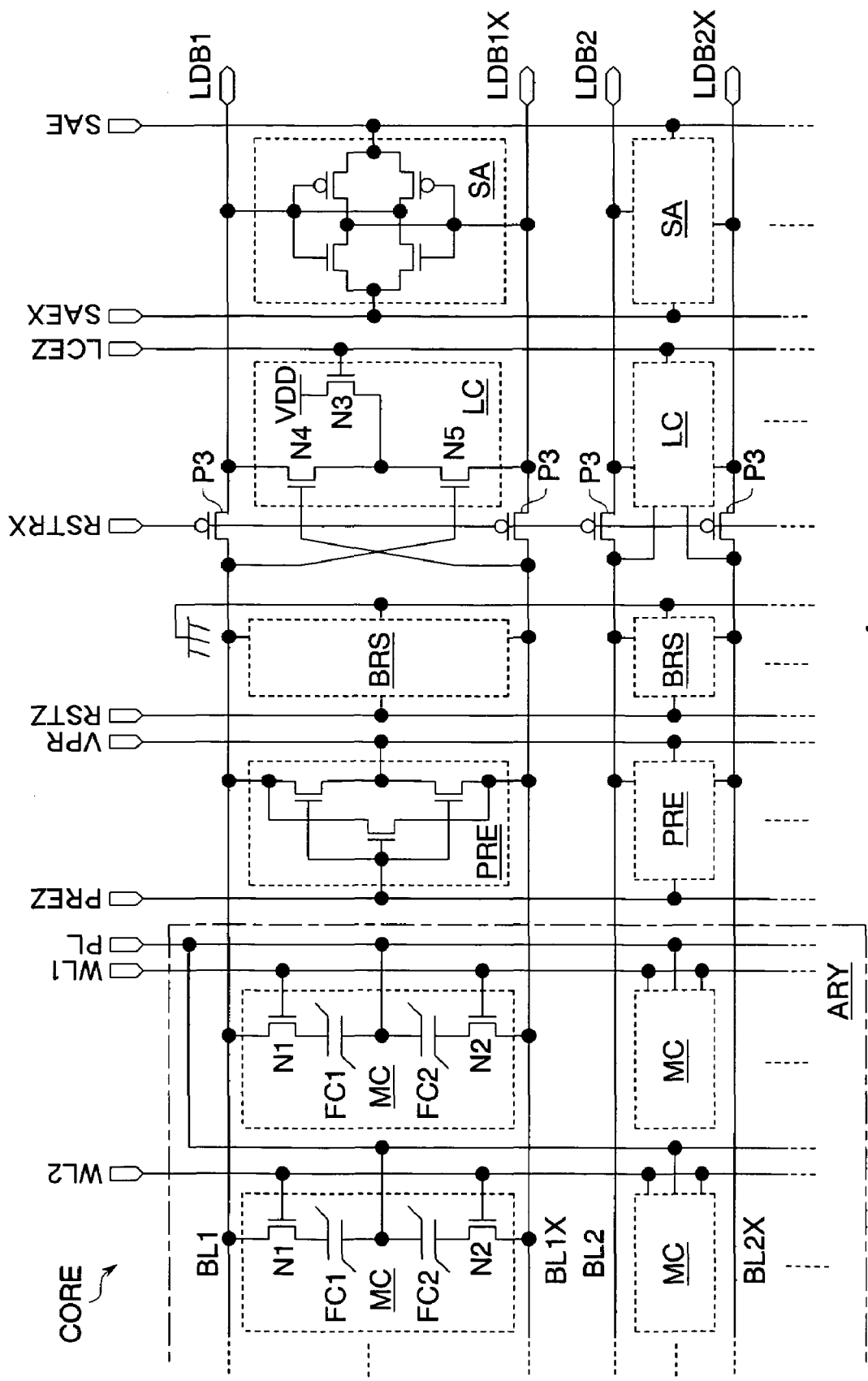
FIG. 4 is a circuit diagram showing the details of the memory core according to a second embodiment of the present invention.

FIG. 4 shows details of a memory core in a second embodiment of a ferroelectric memory according to the invention. Like circuits and signals reference like circuits and signals described in the first embodiment and detailed descriptions thereof are omitted from repeating.

In the embodiment, a level converter LC is different from one in the first embodiment. Other configurations are the same as the first embodiment (FIG. 1). That is, a ferroelectric memory is formed on a silicon substrate by use of a CMOS process and incorporated, as a memory core, in a system LSI mounted on, for instance, a mobile phone.

The level converter LC has a pair of nMOS transistors N4 and N5 where gates thereof are connected respectively to bit lines BL and BLX and an nMOS transistor N3 (leak prevention switch) that connects drains of the nMOS transistors N4 and N5 to a power supply line VDD. Sources of the nMOS transistors N4 and N5 are connected through complementary local data bus lines LDB (LDB1, LDB2, . . . ) and LDBX (LDB1X, LDB2X, . . . ) to an input/output node of the differential sense amplifier SA.

In the embodiment, for instance, in ferroelectric capacitors FC1 and FC2, PZT (coercive voltage=0.8 to 1.0 V) is used as a ferroelectric material, a precharging voltage VPR is set at 0.7 V lower than the coercive voltage and threshold values of the nMOS transistors N4 and N5 of the level converter LC are set at 0.2 V. Accordingly, the level converter LC can amplify voltages of the bit lines BL and BLX that become lower than the precharging voltage VPR during a read operation to transmit to local data bus lines LDB and LDBX. Even in the embodiment, an advantage the same as that of the first embodiment can be obtained.

Figure 5:
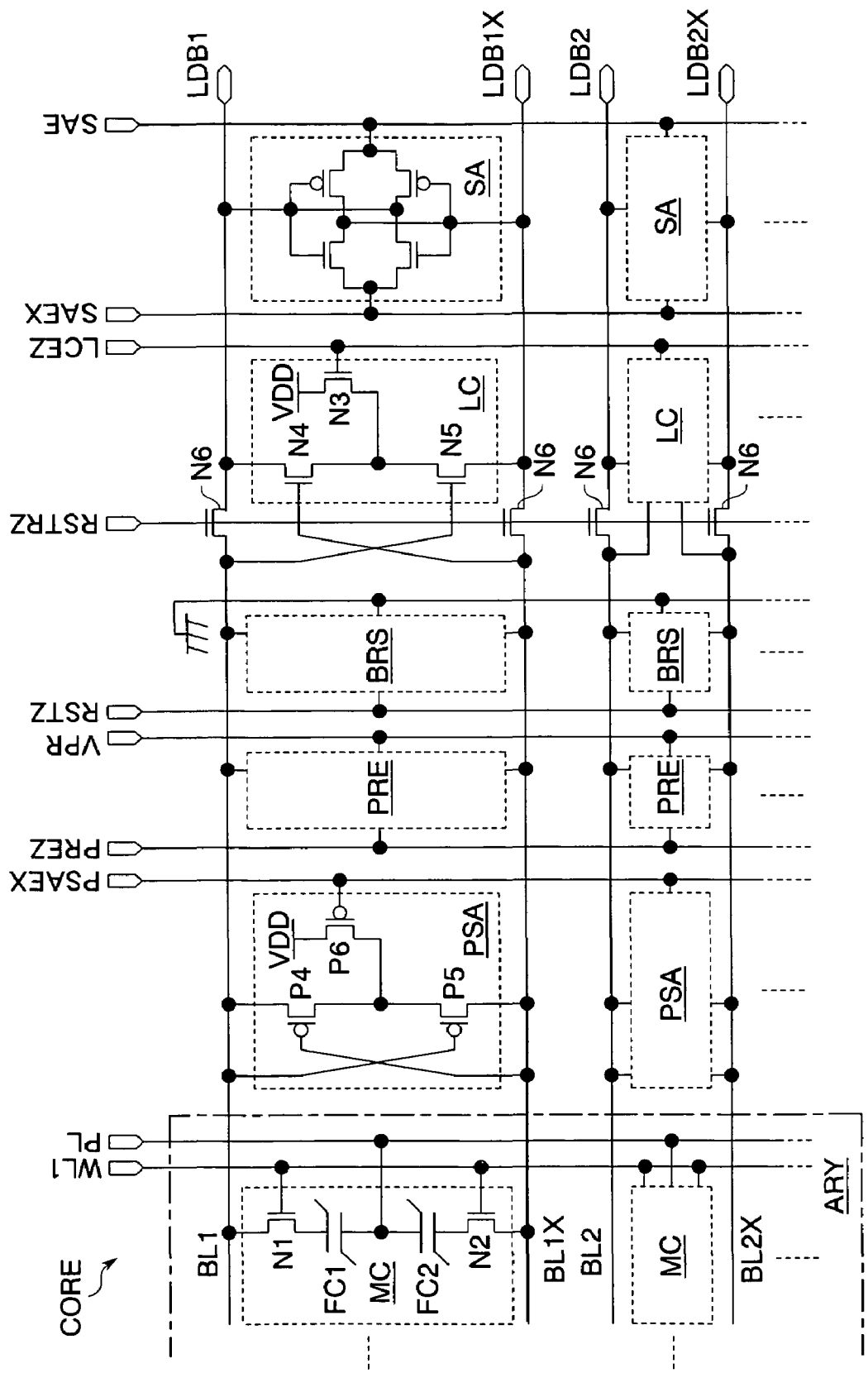
FIG. 5 is a circuit diagram showing the details of the memory core according to a third embodiment of the present invention.

FIG. 5 shows details of a memory core in a third embodiment of a ferroelectric memory according to the invention. Like circuits and signals reference like circuits and signals described in the first and second embodiment and detailed descriptions thereof are omitted from repeating.

In the embodiment, a restore switch is constituted of, in place of the pMOS transistor P3 in the first embodiment, an nMOS transistor N6. A gate of the nMOS transistor N6 receives a restore signal RESRZ. Furthermore, a memory core CORE newly has a pre-sense amplifier PSA. Other configurations are the same as that of the first embodiment (FIG. 1) and second embodiment (FIG. 4). That is, a ferroelectric memory is formed on a silicon substrate by use of a CMOS process and incorporated, as a memory core, in a system LSI mounted on, for instance, a mobile phone.

The pre-sense amplifier PSA includes a pair of pMOS transistors P4 and P5 where gates thereof, respectively, are connected to bit lines BLX (BL1X, BL2X, . . . ) and BL (BL1, BL2, . . . ) and a pMOS transistor P6 that connects sources of the pMOS transistors P4 and P5 to a power supply line VDD. Drains of the pMOS transistors P4 and P5, respectively, are connected to the bit lines BL and BLX. A gate of the pMOS transistor P6 receives a pre-sense signal PSAEX.

Figure 6:
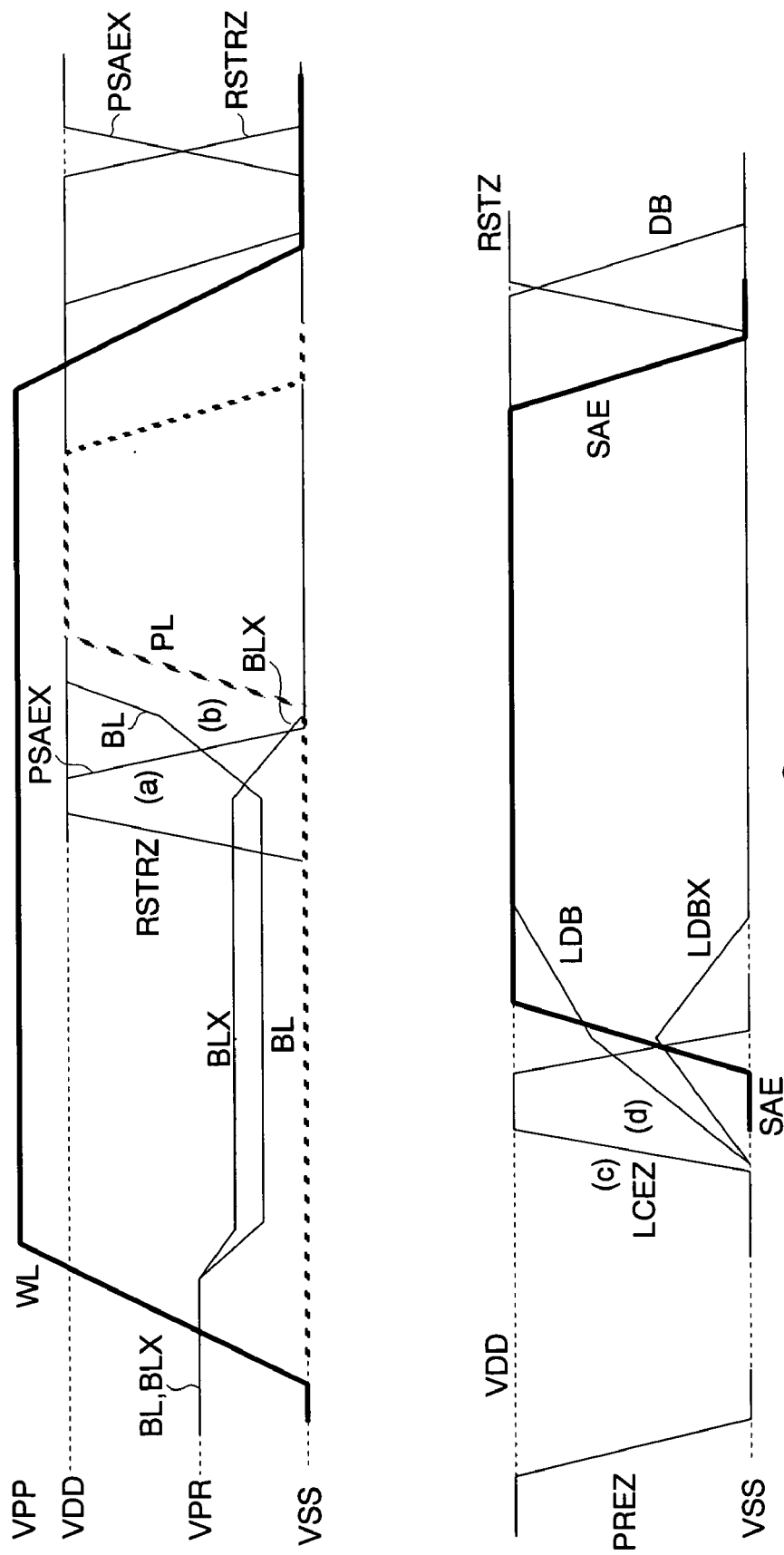
FIG. 6 is a waveform diagram showing a read operation of the ferroelectric memory according to the third embodiment.

FIG. 6 shows a read operation of a ferroelectric memory according to the third embodiment. Operations the same as that described in the FIG. 3 are omitted from detailing. In the embodiment, the pre-sense signal PSAEX is activated after the restore signal RSTRZ is activated and before a plate line PL changes to a high level. A timing when the pre-sense signal PSAEX is inactivated is the same as the restore signal RSTRZ. An activation level (high level voltage) of the restore signal RSTRZ is a power supply voltage VDD (2 V). Other operations are the same as FIG. 3.

The pMOS transistors P4 and P5 of the pre-sense amplifier PSA are activated responding to the activation of the pre-sense signal PSAEX (FIG. 6 (a)). In the example, the pMOS transistor P4 is turned on in response to a change of a bit line BLX corresponding to the local data bus line LDBX changed to a low level voltage VSS to a low level voltage VSS. When the pMOS transistor P4 is turned on, a voltage of the bit line BL assuredly goes up to a power supply voltage VDD (FIG. 6 (b)). Accordingly, restore operations of ferroelectric capacitors FC1 and FC2, without using a boosted voltage VPP in a high level voltage of the restore signal RSTRZ supplied to a gate of the restore switch N6, can be assuredly carried out.

In the embodiment as well, an advantage similar to the first embodiment can be obtained. Furthermore, in the embodiment, in the case of the restore switch N6 being constituted of an nMOS transistor, when a pre-sense amplifier PSA is connected to the bit lines BL and BLX, a high level voltage VDD outputted from the differential sense amplifier SA, without deteriorating, can be transmitted to the bit line BL (or BLX). As a result, the restore operation can be assuredly carried out. Since in a high level voltage of the restore signal RSTRZ a boosted voltage VPP may not be used, the drivability of the booster circuit 22 (FIG. 1) can be made smaller and a layout size thereof can be made smaller.

Figure 7:
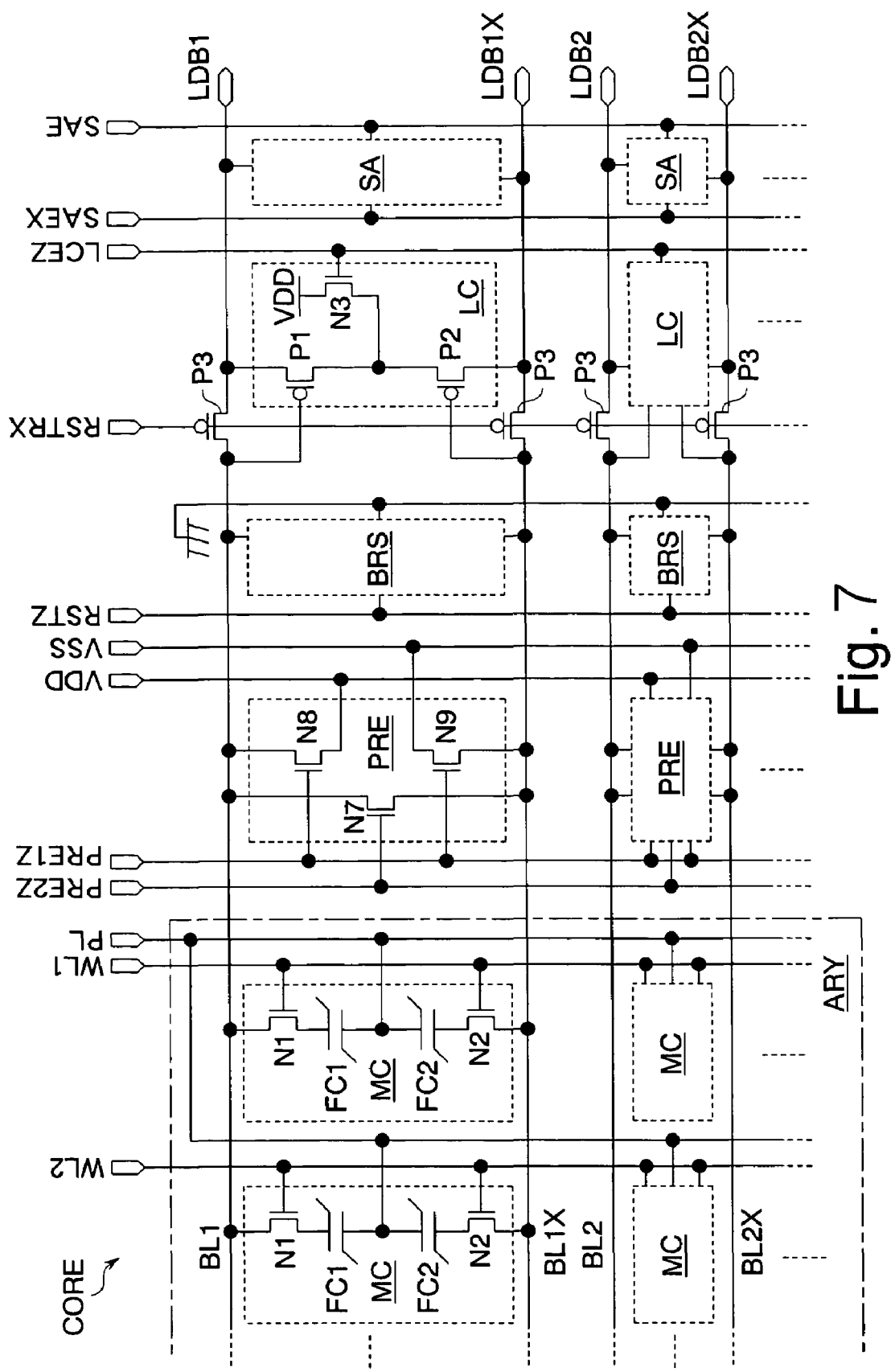
FIG. 7 is a circuit diagram showing the details of the memory core according to a fourth embodiment of the present invention.

FIG. 7 shows details of a memory core in a fourth embodiment of a ferroelectric memory according to the invention. Like circuits and signals reference like circuits and signals described in the first embodiment and detailed descriptions thereof are omitted from repeating.

In the embodiment, a precharging circuit PRE is different from that of the first embodiment. Other configurations are the same as that of the first embodiment. That is, a ferroelectric memory is formed on a silicon substrate by use of a CMOS process and incorporated, for instance, as a memory core, in a system LSI mounted on a mobile phone.

The precharging circuit PRE includes an nMOS transistor N7 (equalizing switch) where a gate thereof is connected to a precharging signal line PRE2Z and one and the other of source and drain, respectively, are connected to bit lines BL and BLX, an nMOS transistor N8 (power switch) where a gate thereof is connected to the precharging signal line PRE1Z, a source is connected to the bit line BL and a drain is connected to a power supply voltage line VDD and an nMOS transistor N9 (ground switch) where a gate thereof is connected to the precharging signal line PRE1Z, a source is connected to the ground line VSS and a drain is connected to the bit line BLX.

Figure 8:
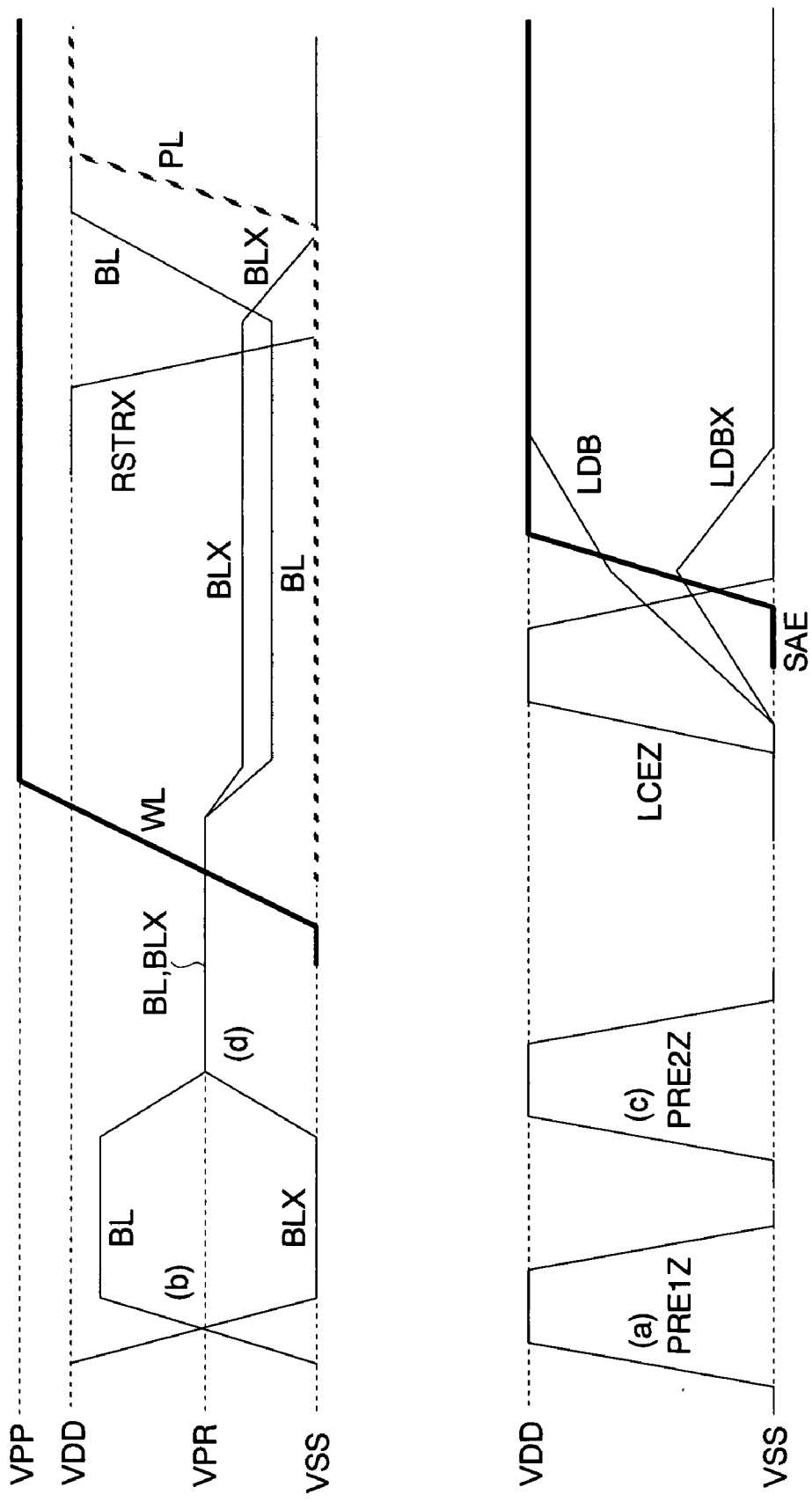
FIG. 8 is a waveform diagram showing a read operation of the ferroelectric memory according to the fourth embodiment.

FIG. 8 shows a read operation of a ferroelectric memory according to the fourth embodiment. Operations the same as that described in the FIG. 3 are omitted from detailing. The embodiment has a feature in a precharging operation of the bit lines BL and BLX before a read operation begins.

In the precharging operation, firstly, a precharging signal PRE1Z is activated for a predetermined period (FIG. 8 (a)) and the bit lines BL and BLX, respectively, change to a high level voltage (VDD-a threshold voltage of an nMOS transistor N8) and a ground voltage VSS. That is, the bit line BL is charged in accordance with a high level voltage (FIG. 8 (b)). After the precharging signal PRE1Z is inactivated, a precharging signal PRE2Z is activated for a predetermined period (FIG. 8 (c)). When the precharging signal PRE2Z is activated, the bit lines BL and BLX are equalized and set at a desired precharging voltage VPR (one half a voltage of the bit line BL) (FIG. 8 (d)). That is, the precharging voltage VPR can be readily generated with a simple circuit that makes use of electric charges charged to the bit line BL.

In the embodiment as well, an advantage similar to that of the first embodiment can be obtained. Furthermore, in the embodiment, the precharging voltage VPR can be readily generated by making use of electric charges charged to the bit line BL.

In the foregoing embodiments, examples where a plate line PL is disposed for the predetermined number of memory cells MC are described. The invention is not restricted to such embodiments. For instance, for all the memory cells MC, a common plate line PL may be disposed. In the invention, during the read operation, the number of times of driving the plate line PL is scarce. Accordingly, a ferroelectric capacitor of a memory cell MC where a read operation is not carried out can be alleviated from deteriorating by a back switching owing to a drive of the plate line PL.

Furthermore, the precharging circuit PRE applied in the fourth embodiment can be applied to the first through third embodiments.

In the foregoing embodiments, examples where the invention is applied to a ferroelectric memory that is mounted on a mobile phone are described. The invention is not restricted to such embodiments. For instance, the invention may be applied to a ferroelectric memory mounted on an IC card. In this case, when, in place of the booster circuit 22, a bootstrap circuit is assembled in a word driver 24, a period from power-on to start of access can be shortened.

The invention is not limited to the above embodiments and various modifications may be made without departing from the spirit and scope of the invention. Any improvement may be made in part or all of the components.

What is claimed is:

1. A ferroelectric memory comprising:
  a memory cell having a pair of ferroelectric capacitors whose polarization vectors are set opposite to each other to hold complementary logical values, respectively;
  a pair of bit lines connected to one ends of said ferroelectric capacitors, respectively;
  a plate line connected to the other ends of said ferroelectric capacitors;
  a voltage setting circuit that sets a voltage difference between both ends of each of said ferroelectric capacitors to be lower than a coercive voltage, in order to charge said ferroelectric capacitors in a read operation; and
  a differential sense amplifier that amplifies a voltage difference between said bit lines in order to read a logical value held in said memory cell, the voltage difference occurring in accordance with a difference in charging amounts of said ferroelectric capacitors.

2. The ferroelectric memory according to claim 1, further comprising
  a level converter having a pair of transistors connected to said bit lines at gates, respectively, connected to a power supply line at either of sources and drains, and connected to differential inputs of said differential sense amplifier at the other of the sources and drains, respectively.

3. The ferroelectric memory according to claim 2, wherein
  said pair of transistors are pMOS transistors.

4. The ferroelectric memory according to claim 2, further comprising:
  a leak prevention switch that connects, in a read operation, either of the sources and drains of the pair of transistors of said level converter to said power supply line for a predetermined period before said differential sense amplifier operates and disconnects the connection immediately before said differential sense amplifier starts operating.

5. The ferroelectric memory according to claim 2, further comprising:
  restore switches that connect differential outputs of said differential sense amplifier to said bit lines, respectively, after said differential sense amplifier starts operating.

6. The ferroelectric memory according to claim 5, further comprising:
  a pre-sense amplifier having pMOS transistors each connected to one of said bit lines at a gate and connected to the other of said bit lines at a drain, and connected to a predetermined voltage line at a source, wherein
  each of said restore switches has an nMOS transistor connected at a source and a drain to one of said bit lines and one of the differential outputs of said differential sense amplifier, respectively.

7. The ferroelectric memory according to claim 1, further comprising:
  a transfer gate that is formed in said memory cell and connects the one ends of said ferroelectric capacitors to said bit lines, respectively; and
  a precharging circuit that temporarily connects, in a read operation, before said transfer gate is turned on, each of said bit lines to a voltage line with a predetermined voltage.

8. The ferroelectric memory according to claim 7, wherein said precharging circuit includes:
  a power supply switch and a ground switch that are temporarily turned on to connect said pair of bit lines, respectively, to a power supply line and a ground line; and
  an equalizing switch that connects said pair of bit lines to each other after said power supply switch and ground switch are turned off.

9. A ferroelectric memory comprising:
  a memory cell having a pair of ferroelectric capacitors whose polarities are set opposite to each other to hold complementary logical values, respectively;

a pair of bit lines connected to one ends of said ferroelectric capacitors, respectively;

a plate line connected to the other ends of said ferroelectric capacitors;

a differential sense amplifier that amplifies a voltage difference between said bit lines in order to read a logical value held in said memory cell, the voltage difference occurring in accordance with a difference in charging amounts of said ferroelectric capacitors; and a level converter having a pair of transistors connected to said bit lines at gates, respectively, connected to a power supply line at either of sources and drains, and connected to an input of said differential sense amplifier at the other of the sources and drains.

10. The ferroelectric memory according to claim 9, wherein
said pair of transistors are pMOS transistors.

11. The ferroelectric memory according to claim 9, further comprising:

a leak prevention switch that connects, in a read operation, either of the sources and drains of the pair of transistors of said level converter to said power supply line for a predetermined period before said differential sense amplifier operates and disconnects the connection immediately before said differential sense amplifier starts operating.

12. The ferroelectric memory according to claim 9, further comprising:

restore switches that connect differential outputs of said differential sense amplifier to said bit lines, respectively, after said differential sense amplifier starts operating.

13. The ferroelectric memory according to claim 12, further comprising:

a pre-sense amplifier having pMOS transistors each connected to one of said bit lines at a gate and connected to the other of said bit lines at a drain, and connected to a predetermined voltage line at a source, wherein each of said restore switches has an nMOS transistor connected at a source and a drain to one of said bit lines and one of the differential outputs of said differential sense amplifier, respectively.

14. The ferroelectric memory according to claim 9, further comprising:

a transfer gate that is formed in said memory cell and connects the one ends of said ferroelectric capacitors to said bit lines, respectively; and a precharging circuit that temporarily connects, in a read operation, before said transfer gate is turned on, each of said bit lines to a voltage line with a predetermined voltage.

15. The ferroelectric memory according to claim 14, wherein said precharging circuit includes:

a power supply switch and a ground switch that are temporarily turned on to connect said pair of bit lines, respectively, to a power supply line and a ground line; and an equalizing switch that connects said pair of bit lines to each other after said power supply switch and ground switch are turned off.

* * * * *